United States Patent
Roberts et al.

(10) Patent No.: US 6,673,670 B1
(45) Date of Patent: Jan. 6, 2004

(54) METHOD OF FORMING A CAPACITOR STRUCTURE AND DRAM CIRCUITRY HAVING A CAPACITOR STRUCTURE INCLUDING INTERIOR AREAS SPACED APART FROM ONE ANOTHER IN A NON-OVERLAPPING RELATIONSHIP

(75) Inventors: Martin Ceredig Roberts, Boise, ID (US); Christophe Pierrat, Hsin-Chu (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/653,152

(22) Filed: Aug. 31, 2000

Related U.S. Application Data

(62) Division of application No. 09/198,034, filed on Nov. 23, 1998.

(51) Int. Cl.$^7$ .................. H01L 21/8242; H01L 21/20
(52) U.S. Cl. .................. 438/253; 438/396; 438/399
(58) Field of Search .................. 438/253, 396, 438/399

(56) References Cited

U.S. PATENT DOCUMENTS

| | | | |
|---|---|---|---|
| 5,408,114 A | 4/1995 | Kinoshita et al. | 257/296 |
| 5,468,670 A | 11/1995 | Ryou | 437/52 |
| 5,476,805 A | * 12/1995 | Woo et al. | 438/253 |
| 5,497,017 A | 3/1996 | Gonzales | 257/306 |
| 5,506,166 A | 4/1996 | Sandhu et al. | 438/396 |
| 5,512,768 A | 4/1996 | Lur et al. | 257/309 |
| 5,804,852 A | 9/1998 | Yang et al. | 257/308 |
| 5,835,337 A | 11/1998 | Watanabe et al. | 361/301.4 |
| 5,872,041 A | 2/1999 | Lee et al. | 438/397 |
| 5,933,742 A | 8/1999 | Wu | 438/398 |
| 5,939,747 A | 8/1999 | Yajima | 257/309 |
| 6,002,574 A | * 12/1999 | Metzler et al. | 361/303 |
| 6,031,262 A | 2/2000 | Sakao | 257/306 |
| 6,051,464 A | * 4/2000 | Chen et al. | 438/255 |
| 6,259,125 B1 | 7/2001 | Fazan et al. | 257/298 |
| 6,259,127 B1 | 7/2001 | Pan | 257/301 |
| 6,323,081 B1 | 11/2001 | Marsh | 438/239 |

FOREIGN PATENT DOCUMENTS

DE      4213945 A1      4/1992

* cited by examiner

*Primary Examiner*—Olik Chaudhuri
*Assistant Examiner*—William M. Brewster
(74) *Attorney, Agent, or Firm*—Wells St. John P.S.

(57) ABSTRACT

Capacitors, DRAM circuitry, and methods of forming the same are described. In one embodiment, a capacitor comprises a first container which is joined with a substrate node location and has an opening defining a first interior area. A second container is joined with the node location and has an opening defining a second interior area. The areas are spaced apart from one another in a non-overlapping relationship. A dielectric layer and a conductive capacitor electrode layer are disposed operably proximate the first and second containers. In another embodiment, the first and second containers are generally elongate and extend away from the node location along respective first and second central axes. The axes are different and spaced apart from one another. In yet another embodiment, a conductive layer of material is disposed over and in electrical communication with a substrate node location. The layer of material has an outer surface with a first region and a second region spaced apart from the first region. A first container is formed over and in electrical communication with the first region and a second container is formed over and in electrical communication with the second region. In yet another embodiment, the first and second containers define container volumes which are discrete and separated from one another.

28 Claims, 6 Drawing Sheets

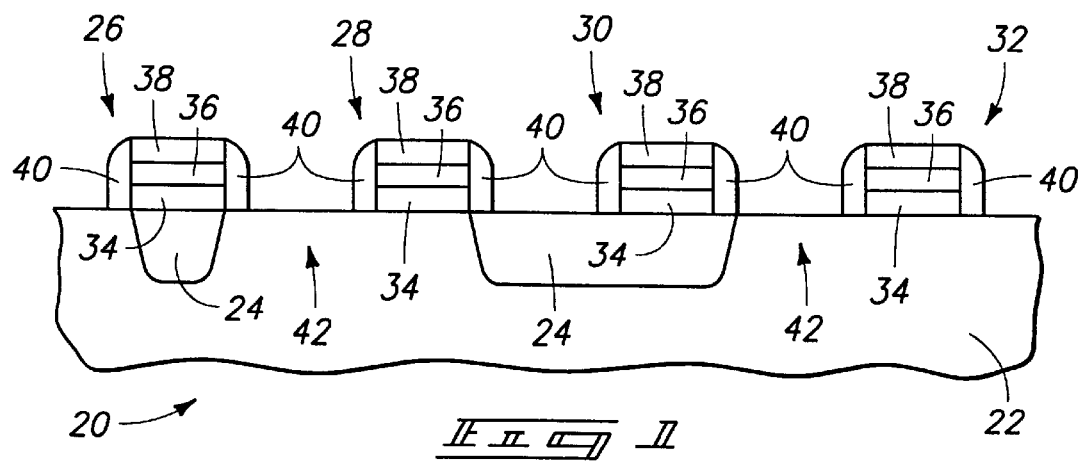
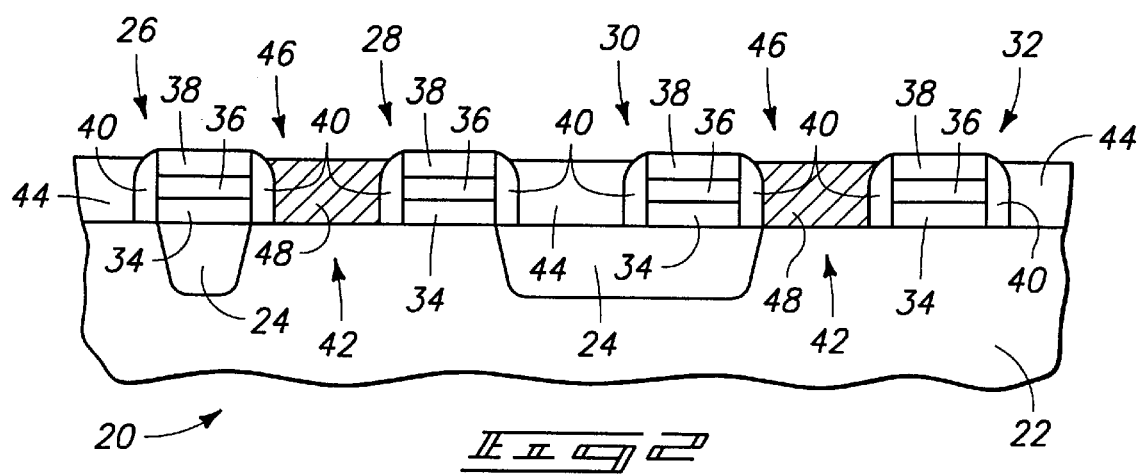

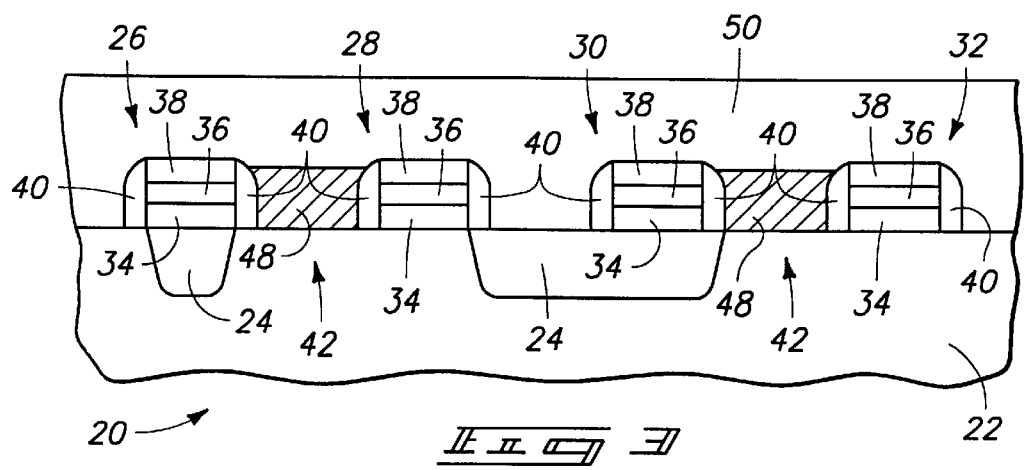
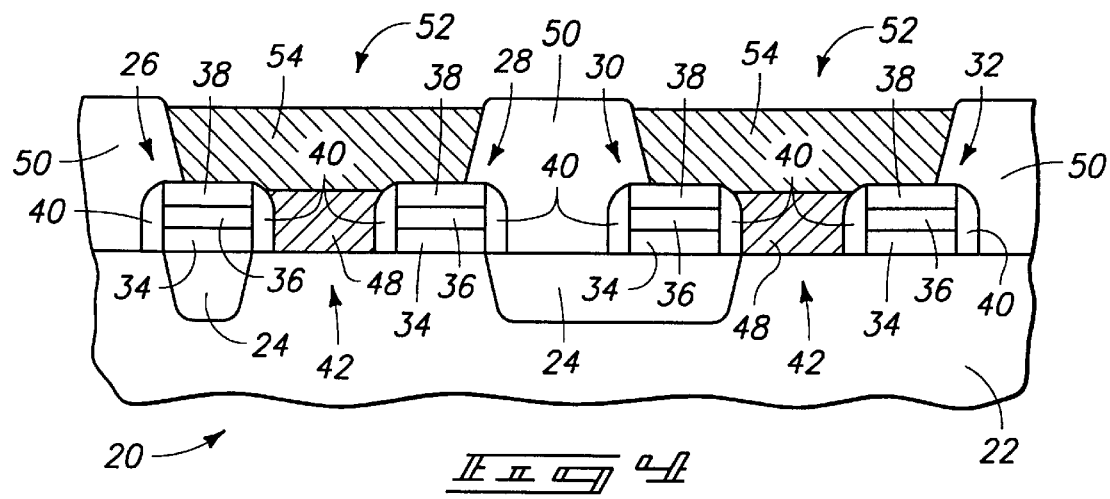

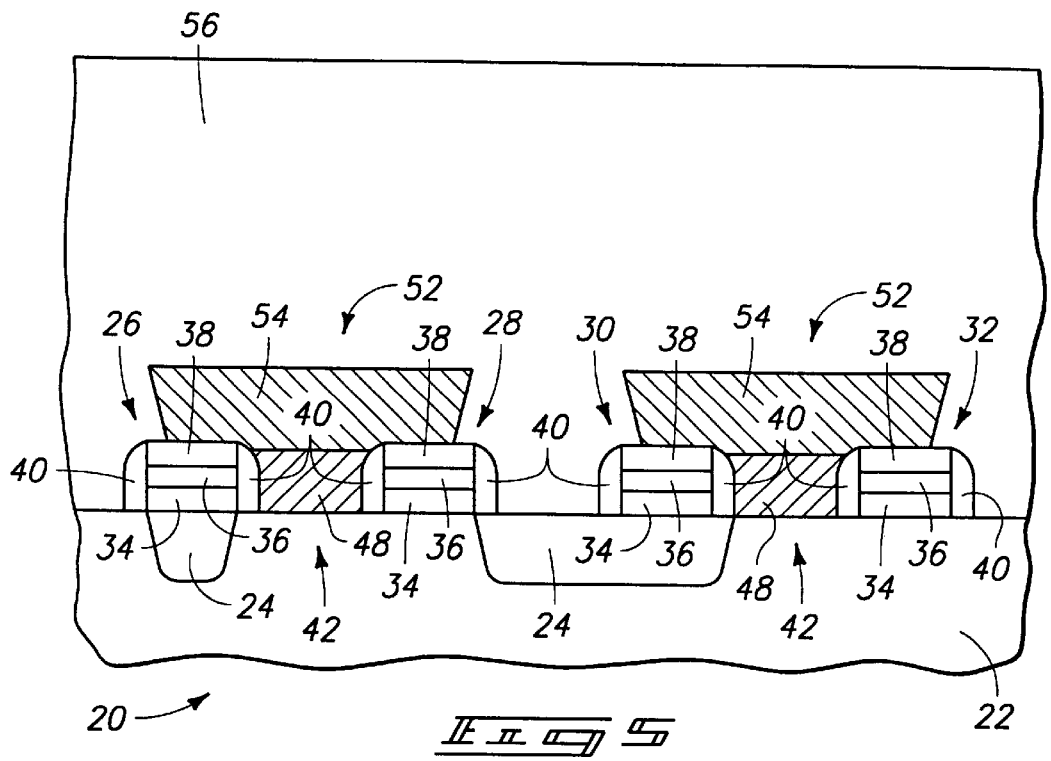
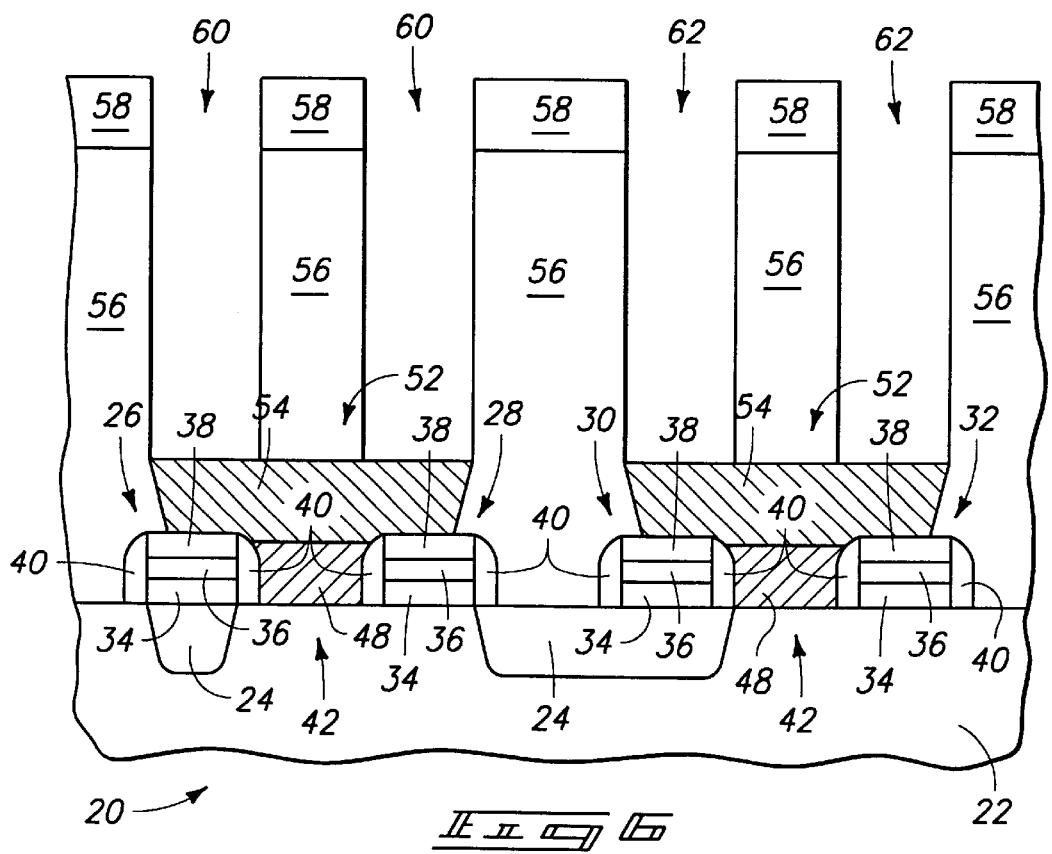

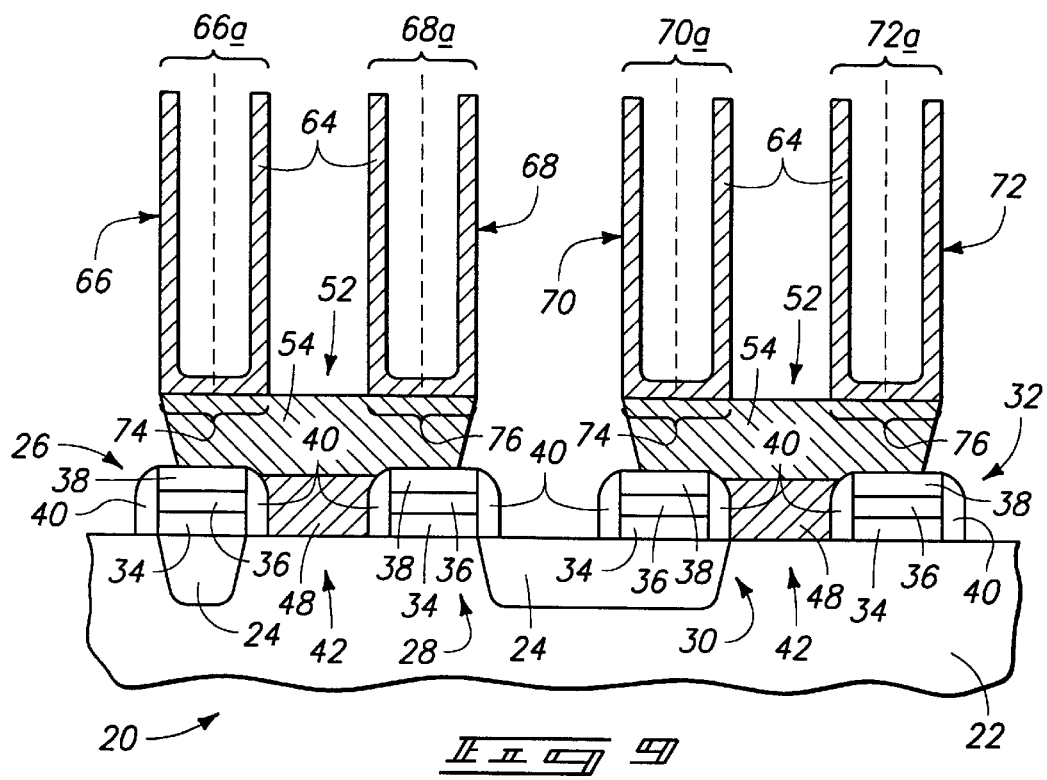
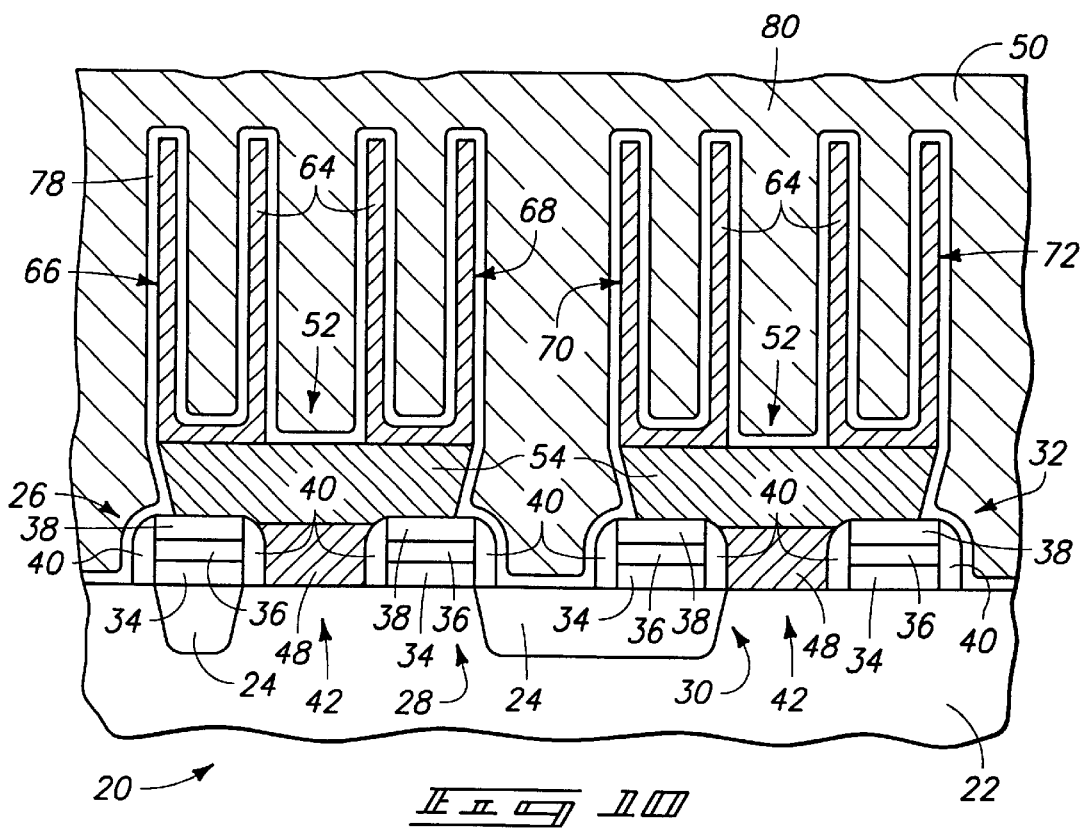

METHOD OF FORMING A CAPACITOR STRUCTURE AND DRAM CIRCUITRY HAVING A CAPACITOR STRUCTURE INCLUDING INTERIOR AREAS SPACED APART FROM ONE ANOTHER IN A NON-OVERLAPPING RELATIONSHIP

RELATED PATENT DATA

This patent is a divisional application of U.S. patent application Ser. No. 09/198,034, which was filed on Nov. 23, 1998, and is hereby incorporated in its entirety by reference.

TECHNICAL FIELD

This invention relates to capacitors, dynamic random access memory (DRAM) circuitry, to methods of forming capacitors, and to methods of forming DRAM circuitry.

BACKGROUND OF THE INVENTION

As integrated circuitry increases in density, there is a continuing challenge to maintain sufficiently high storage capacitances for storage capacitors despite decreasing circuitry dimensions. In particular, as DRAMs increase in memory cell density, there is a continuing challenge to maintain sufficiently high storage capacitance despite decreasing cell areas. Additionally, there is a continuing goal to further decrease cell areas. One principle way of increasing cell capacitance is through cell structure techniques. Such techniques include three-dimensional cell capacitors, such as trench or stacked capacitors.

This invention arose out of concerns associated with improving capacitor storage capabilities through improved structures and formation techniques.

SUMMARY OF THE INVENTION

Capacitors, DRAM circuitry, and methods of forming the same are described. In one embodiment, a capacitor comprises a first container which is joined with a substrate node location and has an opening defining a first interior area. A second container is joined with the node location and has an opening defining a second interior area. The areas are spaced apart from one another in a non-overlapping relationship. A dielectric layer and a conductive capacitor electrode layer are disposed operably proximate the first and second containers. In another embodiment, the first and second containers are generally elongate and extend away from the node location along respective first and second central axes. The axes are different and spaced apart from one another. In yet another embodiment, a conductive layer of material is disposed over and in electrical communication with a substrate node location. The layer of material has an outer surface with a first region and a second region spaced apart from the first region. A first container is formed over and in electrical communication with the first region and a second container is formed over and in electrical communication with the second region. In yet another embodiment, the first and second containers define container volumes which are discrete and separated from one another.

BRIEF DESCRIPTION OF THE DRAWINGS

Preferred embodiments of the invention are described below with reference to the following accompanying drawings.

FIG. 1 is a diagrammatic side sectional view of a semiconductor wafer fragment in process in accordance with one or more embodiments of the present invention, and is taken along line 1—1 in FIG. 11.

FIG. 2 is a view of the FIG. 1 wafer fragment at a processing step which is subsequent to that which is shown in FIG. 1.

FIG. 3 is a view of the FIG. 1 wafer fragment at a processing step which is subsequent to that which is shown in FIG. 2.

FIG. 4 is a view of the FIG. 1 wafer fragment at a processing step which is subsequent to that which is shown in FIG. 3.

FIG. 5 is a view of the FIG. 1 wafer fragment at a processing step which is subsequent to that which is shown in FIG. 4.

FIG. 6 is a view of the FIG. 1 wafer fragment at a processing step which is subsequent to that which is shown in FIG. 5.

FIG. 9 is a view of the FIG. 1 wafer fragment at a processing step which is subsequent to that which is shown in FIG. 8.

FIG. 10 is a view of the FIG. 1 wafer fragment at a processing step which is subsequent to that which shown in FIG. 9.

DETAILED DESCRIPTION OF THE PREFERRED EMBODIMENTS

Figure 7:
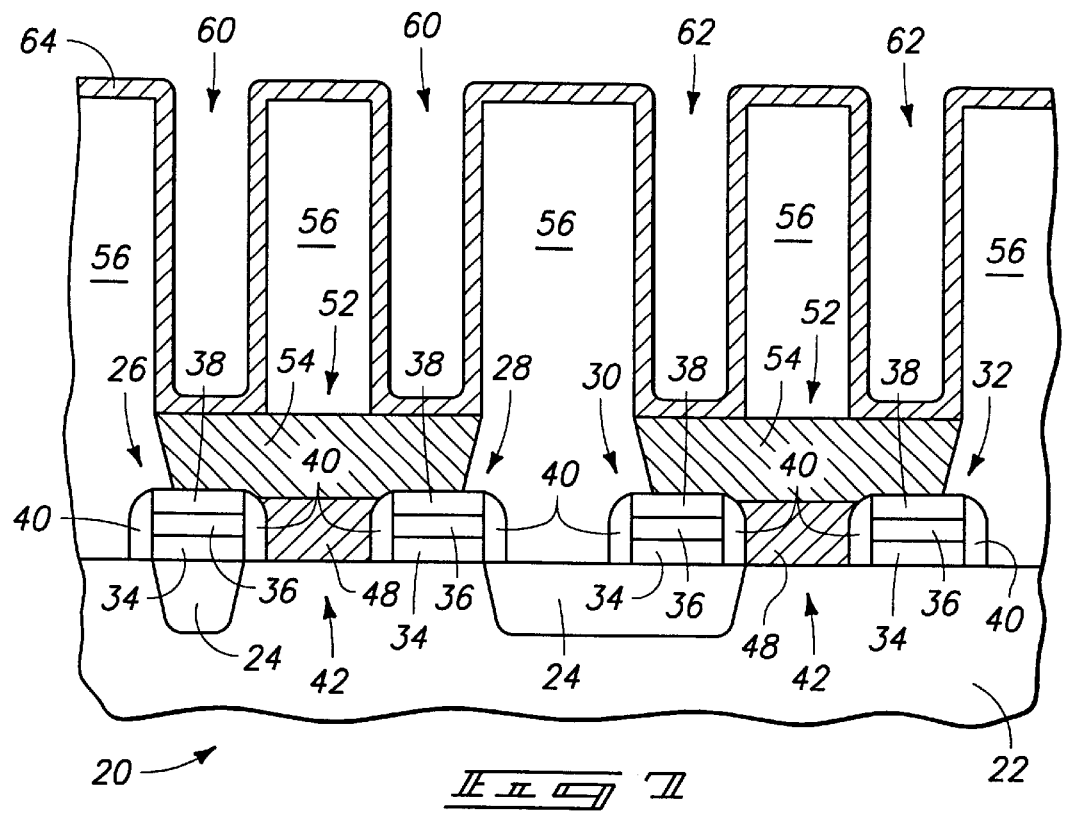
FIG. 7 is a view of the FIG. 1 wafer fragment at a processing step which is subsequent to that which is shown in FIG. 6.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment is shown generally at 20 and includes semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation regions 24 are provided and comprise, typically, an oxide material. Regions 24 can be formed through any suitable technique such as shallow trench isolation techniques. A plurality of conductive lines 26, 28, 30, and 32 are formed over substrate 22 and include, respectively, a gate oxide layer (not specifically shown), a polysilicon layer 34, a silicide layer 36, an insulative cap 38 and sidewall spacers 40. Of course, other conductive line constructions could be used, with lines 26–32 constituting but one example. In the illustrated example, conductive lines 26, 28, 30, and 32 comprise word lines for dynamic random access memory (DRAM) circuitry. Active areas 42 comprising node locations with which electrical communication is desired are defined intermediate isolation regions 24.

Referring to FIG. 2, an insulative layer 44, e.g. BPSG, is formed over substrate 22 and planarized. Openings 46 are etched or otherwise formed into layer 44 sufficiently to expose active areas 42. Such openings can be, and preferably are formed over areas where both storage capacitors and bit lines are to establish electrical communication with respective associated active areas. The openings are filled with conductive material 48, which can be subsequently etched back for isolation over the individual respective active areas. An exemplary material for conductive material 48 is conductively doped polysilicon.

Referring to FIG. 3, a layer 50 is formed over substrate 22 and comprises an insulative material such as BPSG which can be subsequently planarized.

Referring to FIG. 4, openings 52 are etched through layer 50 sufficiently to expose conductive material 48. Additional conductive material 54 is formed over and in electrical communication with conductive material 48 and is isolated within openings 52. An exemplary material for conductive material 54 is conductively doped polysilicon. Openings 52 are formed to coincide with node locations over which storage capacitors are to be formed.

Referring to FIG. 5, an insulative material layer 56, e.g. BPSG, is formed over substrate 22 and subsequently planarized.

Referring to FIG. 6, a patterned masking layer 58, e.g. photoresist, is formed over substrate 22 and pairs of openings 60 (formed over conductive lines 26, 28) and 62 (formed over conductive lines 30, 32) are formed first within masking layer 58, and subsequently etched into layer 56. In a preferred embodiment, improved patterning resolution of the openings can be achieved through utilization of alternating phase shift contrast techniques. In alternating phase shift contrast techniques, immediately adjacent cell areas are provided or fabricated with their light during exposure exactly 180° out of phase. Such can be implemented by using a special mask or reticle. With a special mask or reticle, the glass of the reticle at adjacent openings is provided alternatingly, such that a cut is made into the glass portion of the mask a suitable distance such that the light shifts 180° out of phase. Such can provide better lithographic resolution between adjacent devices.

Referring to FIG. 7, a conductive material layer 64 is formed over substrate 22 and within openings 60, 62. An exemplary material comprises polysilicon.

Figure 8:
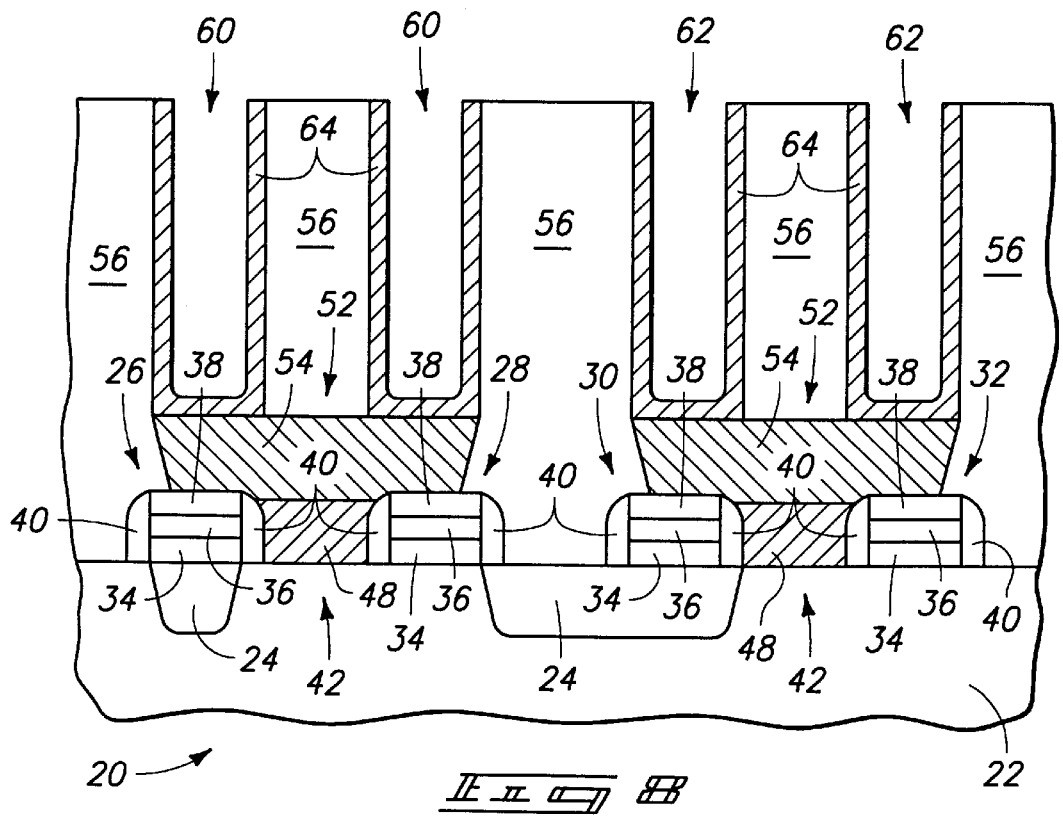
FIG. 8 is a view of the FIG. 1 wafer fragment at a processing step which is subsequent to that which is shown in FIG. 7.

Referring to FIG. 8, material of layer 64 is removed from over selected portions of layer 56 as by chemical-mechanical polishing to isolate conductive material within openings 60, 62. Such effectively forms capacitor containers as will become apparent below. At this point in processing, additional processing can take place to provide roughened surfaces over the interior of conductive material 64 which can increase the capacitance of the resultant capacitors. Such can take place through known techniques for depositing hemispherical grain polysilicon (HSG) or cylindrical grain polysilicon (CSG).

Referring to FIG. 9, material of layer 56 is etched back or otherwise removed from over substrate 22 and effectively defines individual containers 66, 68, 70, and 72. In the illustrated example, two containers are formed for each node location 42. For example, containers 66, 68 comprise first and second containers respectively, which are joined with the leftmost node location 42. Similarly, containers 70, 72 comprise third and fourth containers which are joined with the rightmost node location 42. Each container includes a respective opening 66a, 68a, 70a and 72a away from the node location with which it is associated and which defines an interior area. The interior areas for each container are spaced apart from one another in a non-overlapping relationship.

In this example, containers 66–72 are generally elongate and extend along respective individual central axes (indicated by the dashed lines), and away from the node locations with which each joins. Preferably, the central axes are spaced apart from, and generally parallel with one another. In a preferred embodiment, openings 66a, 68a, 70a and 72a are generally circular in shape and the containers are generally tubular or cylindrical, i.e. generally circular in transverse cross section, in construction.

Alternately considered, conductive material 54 includes an outer surface with first and second regions 74, 76 respectively. The regions are preferably spaced apart from one another, and individual containers 66, 68 are respectively joined with individual first and second regions 74, 76 respectively. The same can be said for containers 70, 72 with respect to regions 74, 76 provided by their associated conductive material 54.

Further alternately considered, formation of containers 66–72 results in containers which define volumes which are substantially the same in magnitude, and which are discrete and separated from one another.

Referring to FIG. 10, a dielectric layer 78 is formed operably proximate each container and a conductive capacitor electrode layer 80 is formed thereover. Collectively, containers 66, 68, dielectric layer 78, and electrode layer 80 provide one storage capacitor for a DRAM array and containers 70, 72, dielectric layer 78, and electrode layer 80 provide another storage capacitor for the DRAM array. In a preferred embodiment, the storage capacitors comprise only two conductive capacitor electrodes separated by a dielectric region.

Figure 11:
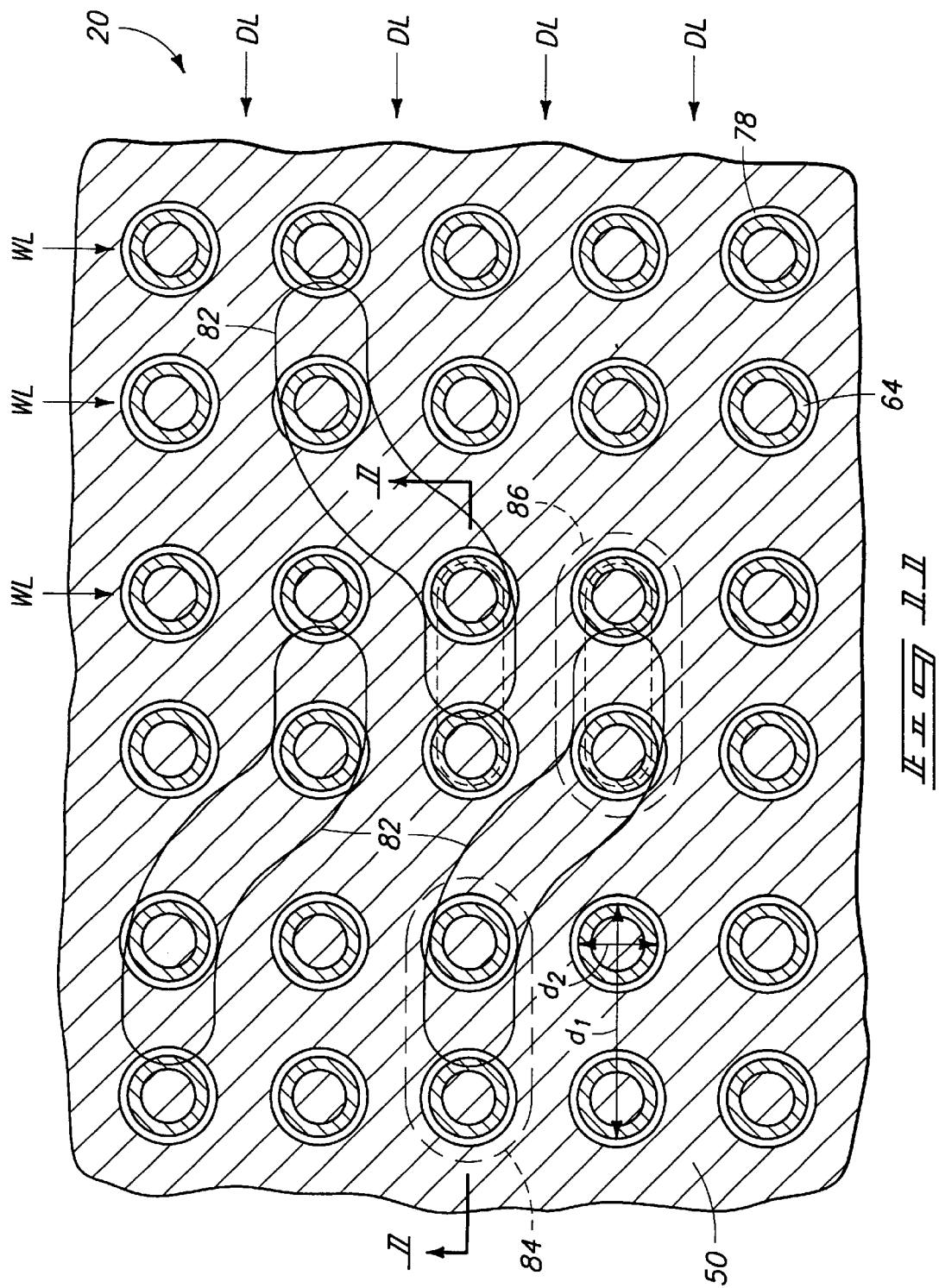
FIG. 11 is a top plan view of a layout of a portion of a semiconductor substrate which has been processed in accordance with one or more embodiments of the present invention.

Referring to FIG. 11, a circuit layout is shown which depicts active areas 82 and individual containers which appear as generally circular regions disposed over or proximate active areas 82. Individual storage capacitors are shown by the dashed lines 84, 86. In this layout, word lines (WL) and digit lines (DL) would extend in the indicated respective directions and generally within the areas occupied by the respective arrows. In a reduction-to-practice example, capacitor containers were fabricated having dimensions $d_1$ and $d_2$ as shown, with $d_1$ being equal to about 0.67 micron, and $d_2$ being equal to about 0.27 micron. Such dimensions can constitute an increase in capacitance from between about 11 percent to 15 percent over conventional DRAM constructions.

Advantages of the present invention can include an increase or gain in capacitance over previous structures without an undesirable associated increase in consumed wafer area.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising:

providing a substrate comprising a node location disposed between two conductive lines, each of the conductive lines comprising a conductive portion and an insulative cap formed on the conductive portion, the insulative cap having an uppermost surface;

forming a first contact structure joined with the node location, the first contact structure comprising an upper surface entirely elevationally at or below the uppermost surface of the insulative cap;

forming a second contact structure joined with the first contact structure;

forming a first container over the second contact structure, the first container being electrically joined with the node location through the first and second contact structures, the first container having an opening defining a first interior area;

forming a second container over the second contact structure, the second container being electrically joined with the node location through the first and second contact structures, the second container having an opening defining a second interior area, the first and second interior areas being spaced apart from one another in a non-overlapping relationship; and forming a dielectric layer and a conductive capacitor electrode layer disposed operably proximate the first and second containers.

2. The method of claim 1, wherein the forming of the first and second containers comprises forming generally elongate first and second containers.

3. The method of claim 1, wherein the forming of the first and second containers comprises forming generally elongate first and second containers which extend along individual central axes which are generally parallel with one another.

4. The method of claim 1, wherein the forming of the first and second containers comprises forming the openings to be generally circular.

5. The method of claim 1, wherein the forming of the first and second containers comprises forming generally elongate first and second containers having openings which are generally circular.

6. The method of claim 1 further comprising forming said capacitor to comprise only two conductive capacitor electrodes separated by a dielectric region.

7. The method of claim 1, further comprising:

forming the first container as a first elongate container extending away from the second contact structure along a first central axis; and forming the second container as a second elongate container extending away from the second contact structure along a second central axis, the second central axis being different and spaced apart from the first central axis.

8. The method of claim 7, wherein the forming of the first and second elongate containers comprises forming the containers to have central axes which are generally parallel with one another.

9. The method of claim 7, wherein the forming of the first and second elongate containers comprises forming the containers to be generally cylindrical in shape.

10. The method of claim 7, wherein the forming of the first and second elongate containers comprises forming the containers to be generally cylindrical in shape and have central axes which are generally parallel with one another.

11. The method of claim 7 further comprising forming said capacitor to comprise only two conductive capacitor electrodes separated by a dielectric region.

12. A method of forming DRAM circuitry comprising:

providing a substrate comprising at least two conductive lines and a node location disposed between two adjacent conductive lines of the at least two conductive lines;

forming a first contact structure disposed between the two adjacent conductive lines, the first contact structure being joined with the node location therebetween;

forming a second contact structure joined with the first contact structure, the second structure elevationally above the first structure and extending laterally outward therefrom, overlying at least a portion of each of the two adjacent conductive lines;

forming a conductive layer of material disposed over and in electrical communication with a second contact structure, the layer of material having an outer surface with first and second spaced apart regions;

forming a first container over and in electrical communication with the first region;

forming a second container over and in electrical communication with the second region; and forming a dielectric layer and a conductive capacitor electrode layer disposed operably proximate the first and second containers.

13. The method of claim 12, wherein the forming of the first and second containers comprises forming the containers to be generally elongate.

14. The method of claim 12, wherein the forming of the first and second containers comprises forming the containers to be generally elongate and extend along respective central axes which are generally parallel with one another.

15. The method of claim 12, wherein the forming of the first and second containers comprises forming the containers to have volumes which are substantially the same in magnitude.

16. The method of claim 12, wherein the forming of the first and second containers comprises forming the containers to be generally elongate and have volumes which are substantially the same in magnitude.

17. The method of claim 12, wherein the forming of the first container, the second container, the dielectric layer, and the conductive capacitor electrode comprises forming a capacitor comprising only two conductive capacitor electrodes separated by a dielectric region.

18. A method of forming DRAM circuitry comprising:

providing a substrate having first and second spaced apart node locations, the first node location being disposed between a first pair of conductive lines and the second node location being disposed between a second pair of conductive lines;

forming a first contact structure in electrical communication with the first node location, at least a portion of the first contact structure overlying a portion of the first pair of conductive lines;

forming a second contact structure in electrical communication with the second node location, at least a portion of the second contact structure overlying a portion of the second pair of conductive lines;

forming a first storage capacitor in electrical communication with the first contact structure and comprising first and second containers;

forming a second storage capacitor in electrical communication with the second contact structure and comprising third and fourth containers, wherein the first, second, third, and fourth containers define container volumes which are discrete and separated from one another; and forming a dielectric layer and conductive capacitor electrode layer disposed operably proximate the first and second storage capacitors.

19. The method of claim 18, wherein the forming of the first and second storage capacitors comprises forming individual containers to be generally elongate.

20. The method of claim 18, wherein the forming of the first and second storage capacitors comprises forming individual containers to be generally elongate and extend along respective central axes at least two of which being parallel.

21. The method of claim 18, wherein the forming of the first and second storage capacitors comprises forming individual containers to be generally elongate and extend along respective central axes which are parallel with one another.

22. The method of claim 18, wherein the forming of the first and second storage capacitors comprises forming individual containers to be generally elongate and cylindrical in shape and extend along respective central axes which are parallel with one another.

23. The method of claim 18, wherein the forming of the first storage capacitor, the second storage capacitor, the dielectric layer and the conductive capacitor electrode layer comprises forming different respective capacitors comprising only two conductive capacitor electrodes separated by a dielectric region.

24. A method of forming a capacitor comprising:
providing a substrate comprising a conductive node location disposed between two conductive lines;
forming a contact structure joined with the at least one conductive node location and overlying at least a portion of each of the two conductive lines;
forming a conductive layer over the contact structure, the conductive layer electrically joined with the conductive node location through the contact strucutre;
photolithographically defining and subsequently forming a first container of a first portion of the conductive layer and a second container of a second portion of the conductive layer, the first and the second container being spaced apart from one another in a non-overlapping manner; and
forming a capacitor dielectric layer and a conductive capacitor electrode layer disposed operably proximate the first and the second containers.

25. The method of claim 24, wherein the forming of the first and second containers comprises forming the containers to be generally elongate.

26. The method of claim 24, wherein the forming of the first and second containers comprises forming the containers to be generally elongate and extend along respective central axes which are generally parallel with one another.

27. The method of claim 24, wherein the forming of the first and second containers comprises forming the containers to have volumes which are substantially the same in magnitude.

28. The method of claim 24, wherein the forming of the first and second containers comprises forming the containers to be generally elongate and have volumes which are substantially the same in magnitude.

* * * * *